US007214996B2

(12) United States Patent
Perillat

(10) Patent No.: US 7,214,996 B2
(45) Date of Patent: May 8, 2007

(54) OPTICAL SEMICONDUCTOR HOUSING WITH TRANSPARENT CHIP AND METHOD FOR MAKING SAME

(75) Inventor: Patrick Daniel Perillat, Sassenage (FR)

(73) Assignee: STMicroelectronics S.A., Montrouge (FR)

( * ) Notice: Subject to any disclaimer, the term of this patent is extended or adjusted under 35 U.S.C. 154(b) by 64 days.

(21) Appl. No.: 10/482,017

(22) PCT Filed: Dec. 21, 2001

(86) PCT No.: PCT/FR01/04143

§ 371 (c)(1),
(2), (4) Date: Nov. 22, 2004

(87) PCT Pub. No.: WO02/054497

PCT Pub. Date: Jul. 11, 2002

(65) Prior Publication Data

US 2005/0082490 A1    Apr. 21, 2005

(30) Foreign Application Priority Data

Dec. 29, 2000  (FR) .................... 00 17264

(51) Int. Cl.
*H01L 21/0232* (2006.01)
(52) U.S. Cl. .................... 257/432; 257/777; 257/686

(58) Field of Classification Search ............... 257/686, 257/787, 777, 788–789, 790–795, 431–435, 257/444
See application file for complete search history.

(56) References Cited

U.S. PATENT DOCUMENTS 5,261,013 A * 11/1993 Murata et al. ............... 358/471
5,835,142 A * 11/1998 Nakamura et al. .......... 348/335
6,396,116 B1 * 5/2002 Kelly et al. .................. 257/432
6,519,044 B1 * 2/2003 Holzapfel et al. .......... 356/616
6,566,745 B1 * 5/2003 Beyne et al. ................ 257/680

FOREIGN PATENT DOCUMENTS

JP      407111235 A *  4/1995

* cited by examiner

*Primary Examiner*—Zandra V. Smith
*Assistant Examiner*—Thanh Y. Tran
(74) *Attorney, Agent, or Firm*—Lisa K. Jorgenson; Jose Gutman; Fleit, Kain, Gibbons, Gutman, Bongini & Bianco P.L.

(57) ABSTRACT

Optical semiconductor package and its method of fabrication, which package comprises a semiconductor component (6), a rear face of which is attached to a front face of a mounting and electrical connection support (2) and a front face of which comprises an optical sensor (9), means (11) for electrically connecting the semiconductor component to the support, a transparent chip (12) placed in front of the semiconductor component, which lies at least in front of the optical sensor, and encapsulation means (21) comprising an encapsulation material which envelopes, in front of the support, the periphery of the semiconductor component and of the chip, without covering at least the central part of the front face of this chip.

6 Claims, 4 Drawing Sheets

OPTICAL SEMICONDUCTOR HOUSING WITH TRANSPARENT CHIP AND METHOD FOR MAKING SAME

FIELD OF THE INVENTION

The present invention relates to an optical semiconductor package and its method of fabrication.

BACKGROUND OF THE INVENTION

In the prior art, optical semiconductor components are fitted in the bottom of the cavity of encapsulation packages which have an attached lid made of a transparent material, the bottom wall of the package being used to provide electrical connections outside the component. Such arrangements are bulky and expensive.

SUMMARY OF THE INVENTION

The aim of the present invention is, in particular, to improve and simplify optical semiconductor devices, especially with the aim of reducing their bulk and their production cost.

The present invention firstly relates to an optical semiconductor package.

According to the invention, this optical semiconductor package comprises a mounting and electrical connection support, a semiconductor component, a rear face of which is attached to a front face of said support and a front face of which comprises an optical sensor, means for electrically connecting said semiconductor component to said support, a transparent chip placed in front of said semiconductor component, which lies at least in front of said optical sensor, and encapsulation means comprising an encapsulation material which envelopes, in front of said support, the periphery of said semiconductor component and of said chip, without covering at least the central part of the front face of this chip.

According to a variant of the invention, said chip is attached to the front face of said semiconductor component by means of a layer of transparent adhesive.

According to another variant of the invention, an annular spacer is inserted between the front face of said semiconductor component and the rear face of said chip, around said optical sensor.

According to the invention, the package may comprise a sealing ring lying in the peripheral interface region between said semiconductor component and said chip.

The subject of the present invention is also a method of fabricating an optical semiconductor package.

According to the invention, this method consists in attaching and electrically connecting, to a front face of a mounting and electrical connection support, a rear face of a semiconductor component, a front face of which comprises an optical sensor, in attaching to the front face of said semiconductor component a transparent chip lying in front of said optical sensor and in sealing the interface region between said optical sensor and the rear face of this transparent chip, in placing said support fitted with said semiconductor component and said chip in a cavity of an injection mold, in a position such that at least the central part of the front face of said chip located facing said optical sensor is covered, and in injecting an encapsulation material into said cavity so as to encapsulate the periphery of said semiconductor component and of said chip in front of said support.

According to the invention, this method may consist in attaching the rear face of said chip to the front face of said semiconductor component by means of a layer of transparent adhesive.

According to the invention, this method may consist in attaching the rear face of said chip to the front face of said semiconductor component by means of an annular spacer lying around said optical sensor.

According to the invention, this method may consist, before molding, in keeping said chip at some distance from said semiconductor component and in forming a sealing ring lying in the peripheral interface region between said semiconductor component and said chip.

BRIEF DESCRIPTION OF THE DRAWINGS

The present invention will be better understood on studying the various optical semiconductor packages according to the present invention, described by way of non-limiting example and illustrated by the drawing in which.

DETAILED DESCRIPTION

The various steps of fabricating an optical semiconductor package 1 will firstly be described with reference to FIGS. 1 to 5, the final structure of the package being shown in FIG. 5.

Figure 1:
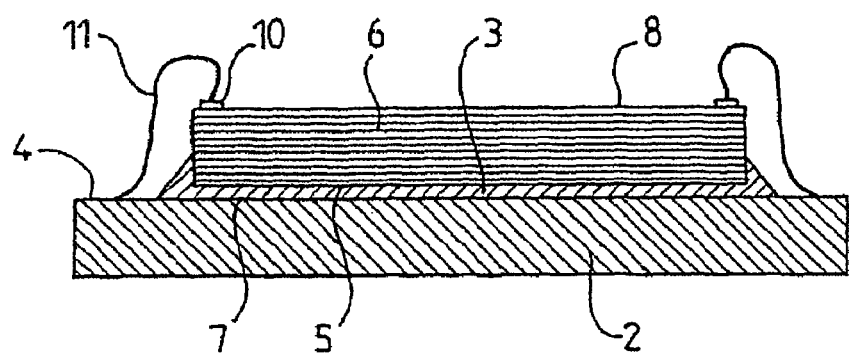
FIG. 1 shows a first optical semiconductor package during fabrication.
Figure 2:
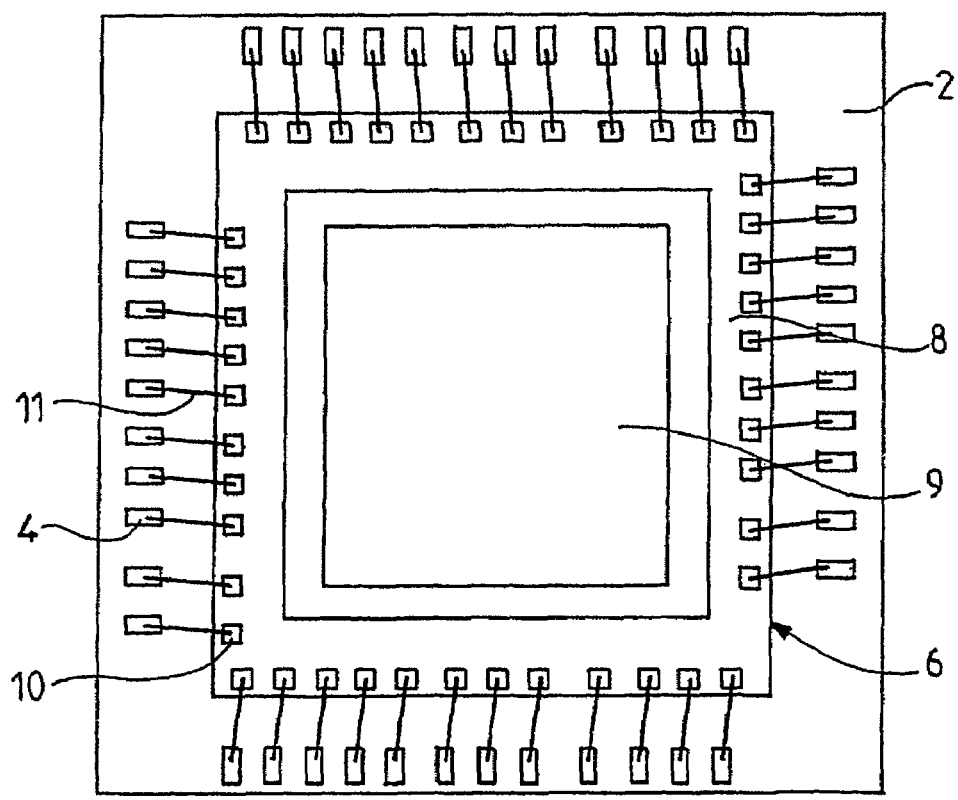
FIG. 2 shows a top view of the package shown in FIG. 1.

Firstly, as shown in FIGS. 1 and 2, a mounting and electrical connection support plate 2 is taken, which has, at the periphery of its front face 3, a multiplicity of electrical connection pads 4.

The rear face 5 of an optical semiconductor component 6 is attached to the central part of the front face 3 of the plate 2 via a layer of adhesive 7, the pads 4 remaining free.

The front face 8 of the optical semiconductor component 6 has, in the central part, an optical sensor 9 and, at the periphery of this sensor 9, a multiplicity of distributed electrical connection pads 10.

The pads 4 of the plate 2 are then selectively connected to the pads 10 of the optical component 6 by means of electrical connection wires 11 in air.

Figure 3:
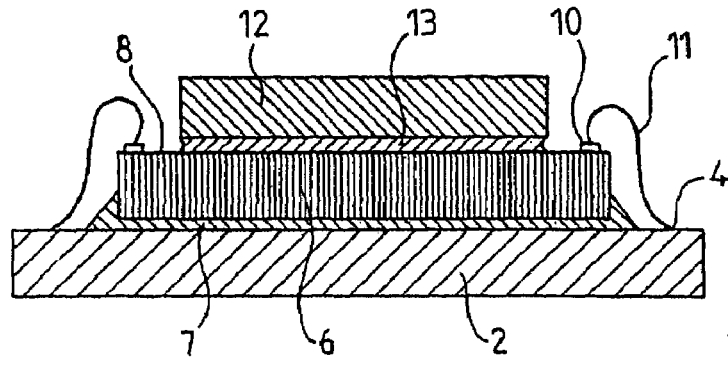
FIG. 3 shows, in section, the first aforementioned package after a subsequent fabrication step.

With reference to FIG. 3, it can be seen that next a transparent chip 12, for example made of glass, is attached to the front face 8 of the optical component 6 by means of a layer of transparent adhesive 13, this chip 12 completely covering the optical sensor 9 of the optical component 6 but not reaching the pads 10 and the wires 11.

Figure 4:
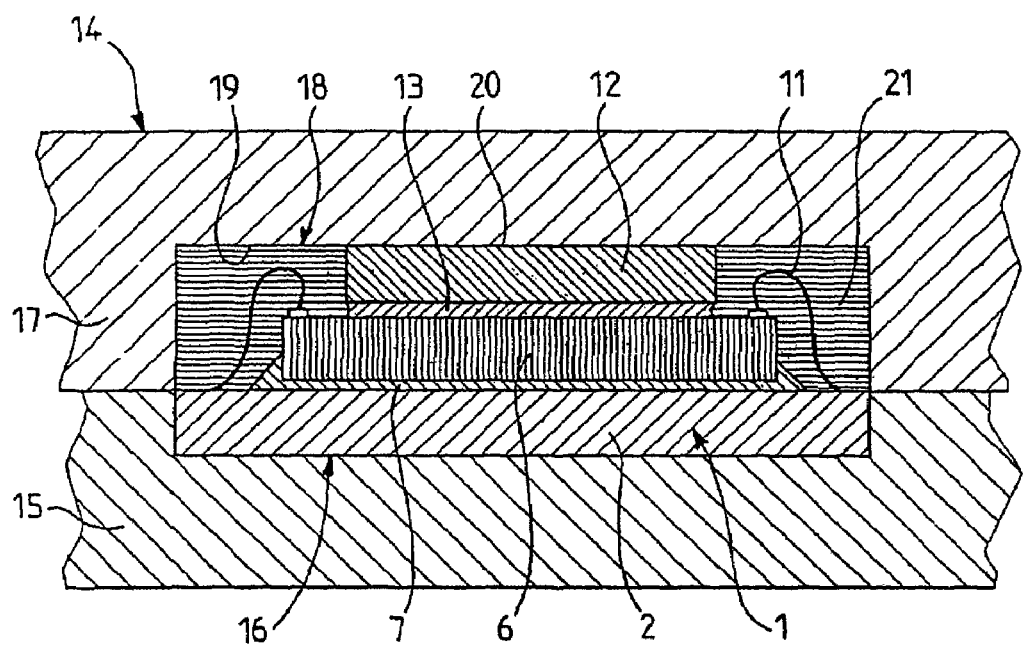
FIG. 4 shows the first aforementioned package during a fourth subsequent fabrication step.

Next, as shown in FIG. 4, the package 11 in the stage of fabrication resulting from FIG. 3 is placed in an injection mold 14, known per se.

This injection mold 14 comprises a lower part 15 in which a cavity 16 is made, dimensioned so as to accommodate the plate 2, and an upper part 17 which comprises a cavity 18 in which the optical component 6, the transparent chip 12 and the wires 11 are arranged, the bottom 19 of this cavity bearing on the front face 20 of the transparent chip 12.

An encapsulation material 21 is then injected into the cavity 18 of the mold 14, this encapsulation material then enveloping the periphery of the optical component 6 and of the transparent chip 12 and embedding the electrical wires 11, without penetrating between the front face 8 of the transparent chip 12 and the bottom 19 of the cavity 18.

Figure 5:
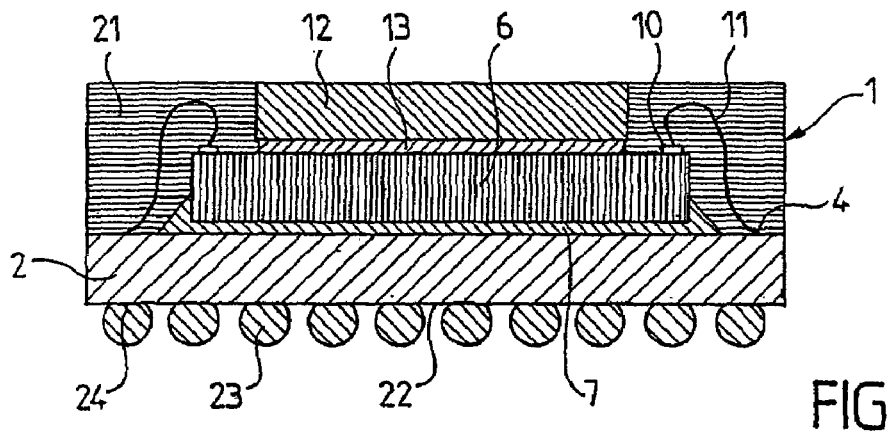
FIG. 5 shows the first aforementioned package after its final fabrication step.

After demolding, as shown in FIG. 5, on the outer rear face 22 of the plate 2, a multiplicity of conducting electrical connection balls 23 are placed on pads 24 of this rear face connected to these front pads 4 by an internal or external electrical connection network (not shown) known per se.

In a variant embodiment, the wires 11 could be put in place after fitting the transparent chip 12.

In another variant embodiment, several packages could be made by implementing a single molding operation in a single cavity containing a common plate 2 carrying several connected components 6 carrying chips 12, so as to obtain a block, this block then being sawn so as to obtain individual optical semiconductor packages 1 is shown.

Thus, the package 1 comprises protection for the optical sensor 9 which consists of the transparent chip 12, directly integrated during the encapsulation operation, the light passing through this chip 12 and the layer of adhesive 13 in order to reach the optical sensor 9.

Figure 6:
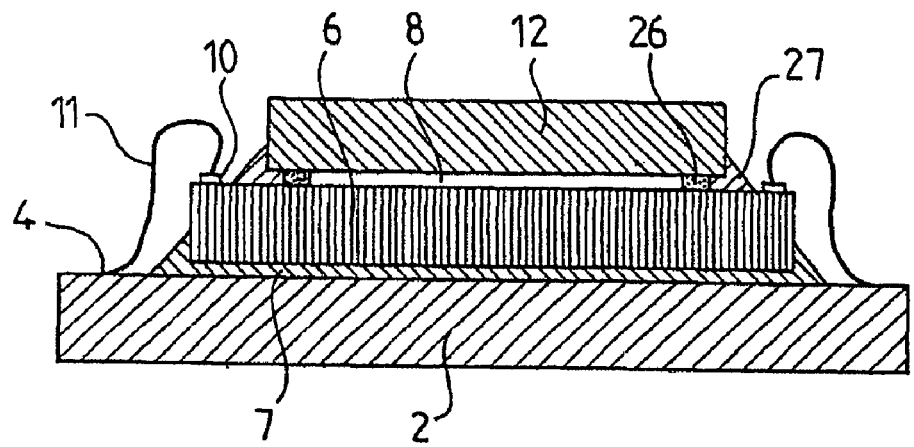
FIG. 6 shows a second optical semiconductor package according to the present invention, during fabrication.
Figure 7:
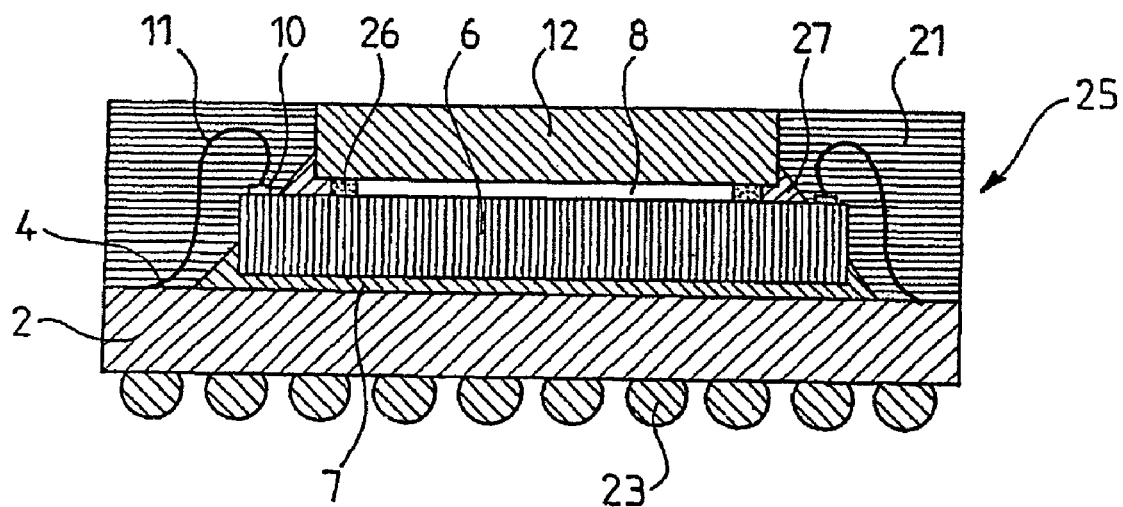
FIG. 7 shows the second aforementioned package after its final fabrication step.

With reference to FIGS. 6 and 7, it can be seen that an optical semiconductor package 25 forming a variant embodiment of the optical semiconductor package 1 is shown.

As shown in FIG. 6, which corresponds to FIG. 3 of the previous example, the transparent chip 12 is attached to the front face 8 of the optical component 6 by means of an annular seal 26 which forms a spacer and which lies between the periphery of the optical sensor 9 and the electrical connection pads 4 and by means of a sealing and holding ring 27 made of an encapsulation material blocking the peripheral interface between the front face 8 of the optical component 6 and the rear face of the transparent chip 12, thereby being retained by the seal 26.

As in the previous example, the wires 11 in air for electrical connection from the pads 4 to the pads 10 may be fitted either before or after mounting the chip 12 on the optical component 6.

This being so, the operation of encapsulation by an encapsulation material 21 may take place in the same way as described above with reference to FIG. 4, the encapsulation material 21 not penetrating into the space separating the face of the optical sensor 9 and the rear face of the transparent chip 12 which are at some distance one from the other, by virtue of the existence of the seal 26 and of the sealing and holding ring 27.

The light therefore passes through the transparent chip 12 and through the space separating the rear face of this chip and the face of the optical sensor 9 before reaching the latter.

Figure 8:
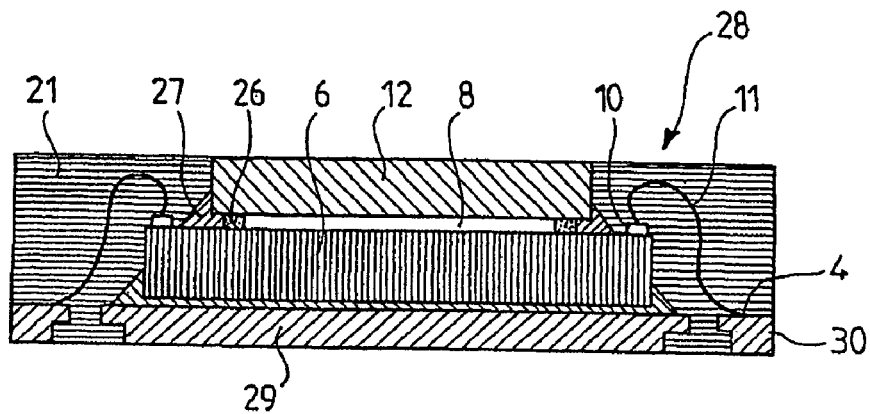
FIG. 8 shows a third optical semiconductor package according to the present invention, after its fabrication.

With reference to FIG. 8, it can be seen that an optical semiconductor package 28 is shown which is different from the semiconductor packages 1 and 25 described above only in that its baseplate 29 comprises external electrical connection means consisting of tracks 30 extending outside the encapsulation 21 and connected to these pads 4 included in the encapsulation 21.

Figure 9:
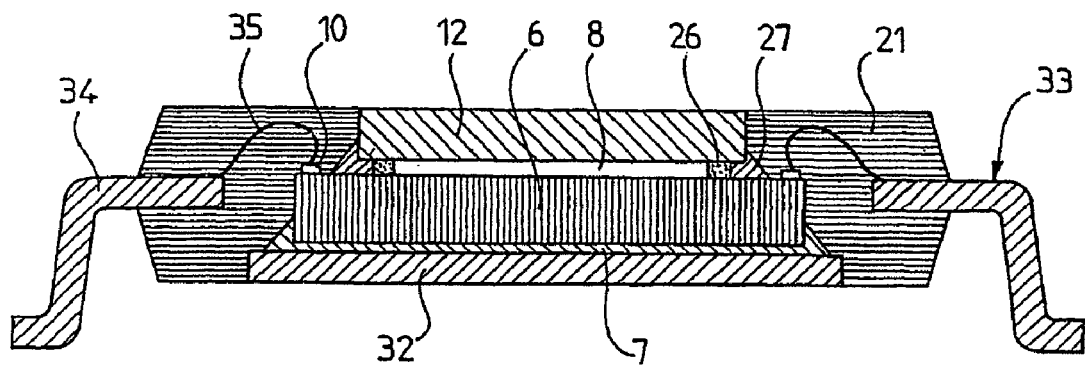
FIG. 9 shows a fourth optical semiconductor package according to the present invention, after its fabrication.

With reference to FIG. 9, it can be seen that an optical semiconductor package 31 is shown which is different from the semiconductor packages described above only in that, this time, the rear face of the optical component 6 is attached to the central platform of a leadframe 33 which has a multiplicity of peripheral electrical connection leads 34 connected to the pad 10 of the optical component 6 by wires 35, the encapsulation material 21 being obtained in a suitable injection mold, known per se, such that the lower parts of the leads 34 are included in this encapsulation material 21.

The present invention is not limited to the examples described above. Many variant embodiments are possible without departing from the scope defined by the appended claims.

What is claimed is:

1. An optical semiconductor package comprising:
    a mounting and electrical connection support;
    a semiconductor component, a rear face of which is attached to a front face of the support and a front face of which comprises an optical sensor;
    means for electrically connecting the semiconductor component to the support;
    a transparent chip placed in front of the semiconductor component, which lies at least in front of the optical sensor; and
    encapsulation means comprising an encapsulation material which envelopes, in front of the support, the periphery of the semiconductor component and of the chip, without covering at least the central part of the front face of the transparent chip, and wherein an annular spacer is inserted between the front face of the semiconductor component and the rear face of the transparent chip, around the optical sensor.

2. The optical semiconductor package according to claim 1, further comprising a sealing ring lying in the peripheral interface region between the semiconductor component and the chip.

3. A method of fabricating an optical semiconductor package, the
    method comprising the steps of:
    attaching and electrically connecting, to a front face of a mounting and electrical connection support, a rear face of a semiconductor component, a front face of which comprises an optical sensor;
    attaching to the front face of the semiconductor component a transparent chip lying in front of the optical sensor and sealing the interface region between the optical sensor and the rear face of the transparent chip;
    attaching the rear face of the transparent chip to the front face of the semiconductor component by means of an annular spacer lying around the optical sensor;
    placing the support fitted with the semiconductor component and the chip in a cavity of an injection mold, in a position such that at least the central part of the front face of the chip located facing the optical sensor is covered; and
    injecting an encapsulation material into the cavity so as to encapsulate the periphery of the semiconductor component and of the chip in front of the support.

4. The method according to claim 3, comprising the steps of:
- before the molding operation, keeping the transparent chip at some distance from the semiconductor component by virtue of an annular spacer; and
- forming a sealing ring lying in the peripheral interface region between the semiconductor component and the chip.

5. An optical semiconductor device comprising:
- an electronic circuit; and
- an optical semiconductor packaging arrangement comprising:
  - a mounting and electrical connection support;
  - a semiconductor component, a rear face of which is attached to a front face of the support and a front face of which comprises an optical sensor electrically coupled to the electronic circuit;
  - means for electrically connecting the semiconductor component to the support;
  - a transparent chip placed in front of the semiconductor component, which lies at least in front of the optical sensor; and
  - encapsulation means comprising an encapsulation material which envelopes, in front of the support, the periphery of the semiconductor component and of the chip, without covering at least the central part of the front face of the transparent chip, and wherein an annular spacer is inserted between the front face of the semiconductor component and the rear face of the transparent chip, around the optical sensor.

6. The optical semiconductor device of claim 5, further comprising a sealing ring lying in the peripheral interface region between the semiconductor component and the chip.

* * * * *